United States Patent

[11] 3,610,981

[72] Inventor Lawrence Henry Gilligan
Nashua, N.H.

[21] Appl. No. 14,351
[22] Filed Feb. 26, 1970
[45] Patented Oct. 5, 1971
[73] Assignee Itek Corporation
Lexington, Mass.

[54] RADIANT ENERGY RESPONSIVE CIRCUIT PROVIDING LOGARITHMIC RESPONSE CHARACTERISTIC
10 Claims, 3 Drawing Figs.

[52] U.S. Cl. .......... 250/214 P, 307/311, 95/64 D
[51] Int. Cl. .......... H01j 39/12
[50] Field of Search .......... 250/211 J, 214, 206; 307/229, 304, 311; 320/145; 178/7.2 E, 7.82, 7.92; 95/64 D

[56] References Cited

UNITED STATES PATENTS

| | | | |
|---|---|---|---|
| 3,320,532 | 5/1967 | Watters .......... | 328/145 |
| 3,459,944 | 8/1969 | Triebwasser .......... | 250/211 |

*Primary Examiner*—Walter Stolwein
*Attorneys*—Homer O. Blair, Robert L. Nathans, William C. Roch and John Edward Toupal

ABSTRACT: Disclosed is logarithmically responsive radiant energy measuring system employing a photosensitive field effect transistor. A feedback circuit induces output voltage responsive variations in the field effect transistor's gate impedance to provide the desired logarithmic response characteristic.

INVENTOR:
LAWRENCE H. GILLIGAN,
BY John E. Toupal ATTORNEY

INVENTOR:
LAWRENCE H. GILLIGAN
BY John E. Toupal
ATTORNEY

RADIANT ENERGY RESPONSIVE CIRCUIT PROVIDING LOGARITHMIC RESPONSE CHARACTERISTIC

BACKGROUND OF THE INVENTION

This invention relates generally to radiant energy responsive systems and, more specifically, relates to a wide range logarithmic response light meter having a photosensitive field effect transistor as a light sensing element.

Photosensitive field effect transistors or "FETs" are employed in various light measuring and light responsive control devices. Basically, a photosensitive FET is a conventional FET modified to include a glass lens top that focuses incident light on its gate junction electrode. Variations in the level of incident radiation alters gate leakage which in turn produces a change in drain electrode current and output voltage. Consequently, the measured output voltage of a photosensitive FET provides an indication of incident light level.

Although its light sensitivity is good, the inherent linear response of a photosensitive FET renders it less than fully satisfactory for a number of control systems. Because of its linear response, the photosensitive FET either offers a limited dynamic range or inadequate response at low incident light levels. These deficiencies are particularly significant in most photographic and television control systems in which more sensitive response is desired at lower light levels of a required operating range than at higher light levels thereof. Generally, such systems require control operations that are logarithmically related to incident light levels.

The object of the invention, therefore, is to provide an improved light measuring device employing a photosensitive field effect transistor as a light sensor and exhibiting a logarithmic response characteristic.

CHARACTERIZATION OF THE INVENTION

The invention is characterized by the provision of a radiant energy measuring system including a photosensitive FET with a gate junction electrode adapted to sense incident radiation. A voltage source establishes a suitable potential between the FET's drain and source electrodes so as to generate a drain current magnitude exhibiting a relationship to the level of radiation incident on the gate electrode. A feedback circuit responsive to drain current is utilized to establish a logarithmic variation in the relationship between the level of incident radiation and the drain current magnitude. In this way the FET is changed from a linear to a logarithmically responsive light sensor.

According to a preferred embodiment of the invention, the FET's gate circuit impedance is varied to produce the variable relationship between incident radiation and drain current magnitude. The effective value of gate circuit impedance is modulated by the feedback circuit connected between the FET's gate and drain electrodes. By appropriate variation of gate impedance, the sensitivity of the FET is selectively modified to provide the logarithmic response characteristic desired.

One feature of the invention is the provision of a measuring system of the above-type employing a second FET as the gate impedance for the photosensitive FET. The feedback circuit applies a control voltage to the gate electrode of the second FET so as to vary the effective impedance it provides in the gate circuit of the photosensitive FET. The variation is inversely related to the magnitude of the photosensitive FET's drain current. This arrangement effectively controls gate impedance in an efficient manner to establish the desired logarithmic output response characteristic.

The invention is further characterized by the provision of a radiant energy responsive system employing the above-described radiant energy measuring circuit to control a regulator that in turn regulates a sensitivity adjustment of a visual data responsive device. In a preferred embodiment the regulator is a servomechanism that adjusts the effective lens aperture of a film camera. Because of its logarithmic output response, the above-described light measuring circuit is particularly suited for use as control mechanism for film cameras as well as for other visual data responsive devices including vidicon camera tubes and film processing equipment.

DESCRIPTION OF THE DRAWINGS

These and other objects and features of the invention will become more apparent upon a perusal of the following description taken in conjunction with the accompanying drawings wherein.

DESCRIPTION OF A PREFERRED EMBODIMENT

Figure 1:
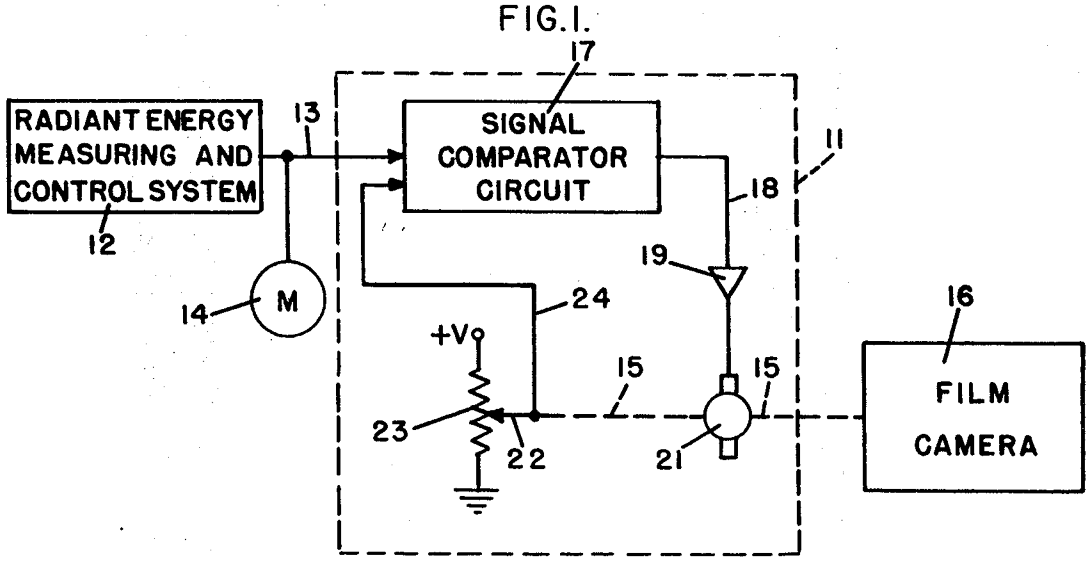
FIG. 1 is a schematic block diagram illustrating a preferred embodiment of the invention.

Referring now to FIG. 1 there is shown a servomechanism regulator system 11 receiving a control signal from a radiant energy measuring and control system 12 on an input line 13. Also receiving the control signal on line 13 is a light meter 14. Mechanically coupled to the regulator system 11 by a shaft 15 is a film camera 16. Although the preferred embodiment entails regulation of the film camera 16, the invention contemplates the regulation of other visual data responsive devices including, for example, vidicon camera tubes, film processing equipment, etc.

The regulator system 11 includes a signal comparator circuit 17 that receives the input signal on line 13 and provides an output signal on line 18. After amplification in an amplifier 19 the output signal on line 18 is utilized to energize a servomotor 21 mechanically keyed with the shaft 15. Regulated by the position of the shaft 15 are a variable lens aperture of the camera 16 and contact 22 of a potentiometer 23. A reference signal produced by the potentiometer 22 on line 24 is compared with the input control signal on line 13 by the signal comparator circuit 17 providing a difference error signal on output line 18.

During operation, the measuring and control system 12, described in greater detail below, produces on line 13 a control voltage logarithmically related to the light level incident on the lens of the camera 16. This control signal is compared with the reference signal on line 24 by the signal comparator circuit 17. Any error signal on line 18 representing the difference between the signals on lines 13 and 24 induces rotation of the servomotor 21. Resultant movement of the shaft 15 changes the lens aperture size of the camera 16 as well as the voltage output setting of the potentiometer 23. Thus, the output voltage of the potentiometer on line 24 is directly related to the lens aperture size of the camera 16.

The mechanical coupling between the camera 16 and the potentiometer 23 is such that for any given lens aperture setting the reference voltage on line 24 equals the control voltage produced by the measuring system 12 in response to a light level suitable for that aperture setting. Thus, the comparator circuit 17 produces no error signal and the regulator system 11 remains stationary if the lens aperture setting of the camera 16 corresponds to the light level sensed by the measuring system 12. In response to a reduction in light level, however, the control voltage on line 13 decreases resulting in an error signal of a given polarity on line 18. That error signal induces rotation of the servomotor 21 in a sense that increases the aperture size of the camera 16 until a setting suitable for the sensed light level is achieved. At that time balance is restored to the signals on lines 13 and 24 and the regulator becomes inactive. Conversely, a detected increase in incident light level initiates analogous regulator operation of the opposite sense to reduce aperture size until balance is again restored.

Figure 2:
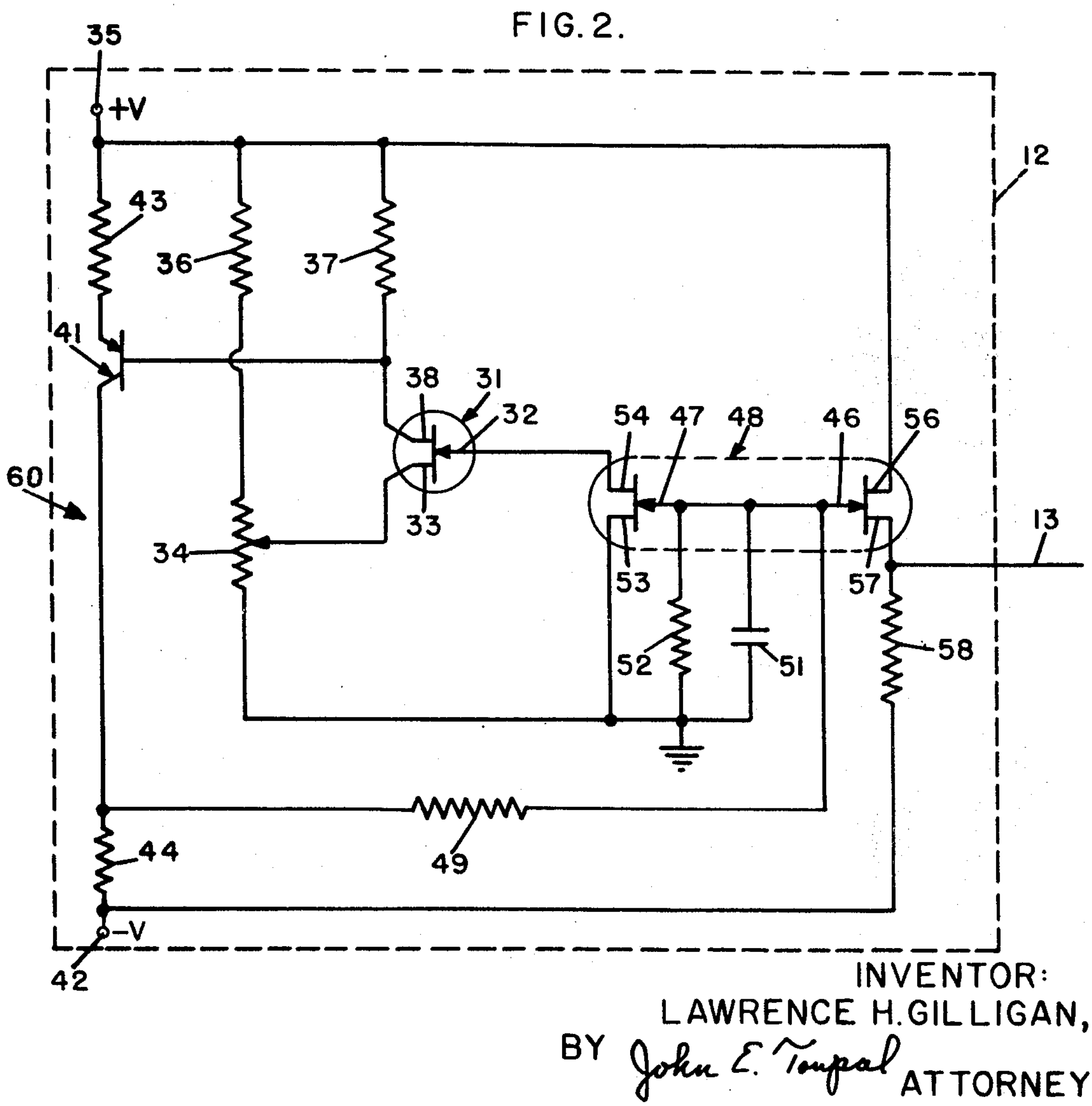
FIG. 2 is a schematic circuit diagram of the radiant energy measuring and control system shown in FIG. 1.

FIG. 2 schematically illustrates circuit details of the measuring and control system 12 shown in FIG. 1. A field effect transistor 31 has a photosensitive junction electrode 32 disposed to receive light from the same source utilized by the camera 15 shown in FIG. 1. A source electrode 33 of the FET 31 is connected to the adjustable contact of a potentiometer 34 coupled between ground and a positive voltage source 35 by a resistor 36. Also connected to the voltage source 35 by a load resistor 37 is a drain electrode 38 of the FET 31.

A transistor amplifier 41 is coupled between the positive voltage source 35 and a negative voltage source 42 by, respectively, resistors 43 and 44. The base electrode of the transistor 41 is connected directly to the drain electrode 38 of the FET 31. Arranged between the collector of the transistor 41 and the common gate electrodes 46 and 47 of a dual FET 48 is a resistor 49. A parallel combination of a capacitor 51 and a resistor 52 is coupled between ground and the gate electrodes 46 and 47 of the dual FET 48. One source electrode 53 of the FET 48 is connected to ground while the associated drain electrode 54 is connected to the gate electrode 32 of the photosensitive FET 31. The other drain and source electrodes 56 and 57 of the dual FET 48 are arranged between the positive voltage source 35 and the output signal line 13 shown in FIG. 1. Also connected to the source electrode 57 by a resistor 58 is the negative voltage source 42.

During operation of the light measuring circuit 12, the photosensitive FET 31 responds in the conventional manner to radiation incident upon its gate junction electrode 32. As the level of incident radiation, λ, increases, leakage, $\lambda I_g$, at the gate electrode 32 also increases. This leakage current times the gate impedance, $R_g$, provided by the left half of the dual FET 48, establishes gate voltage, $V_g$. In turn gate voltage times the FET's transconductance, $G_m$ $_m$determines drain current, $I_d$, at the drain electrode 38 while drain current times load resistance, $R_1$, provided by the load resistor 37, establishes output voltage, $V_o$.

Therefore:

$\lambda I_g \times R_g = V_g$ (1)

$V_g \times G_m = I_d$ (2)

$I_d \times R_1 = V_o$ (3)

$V_o = \lambda I_g \times R_g \times G_m \times R_1$ (4)

Figure 3:
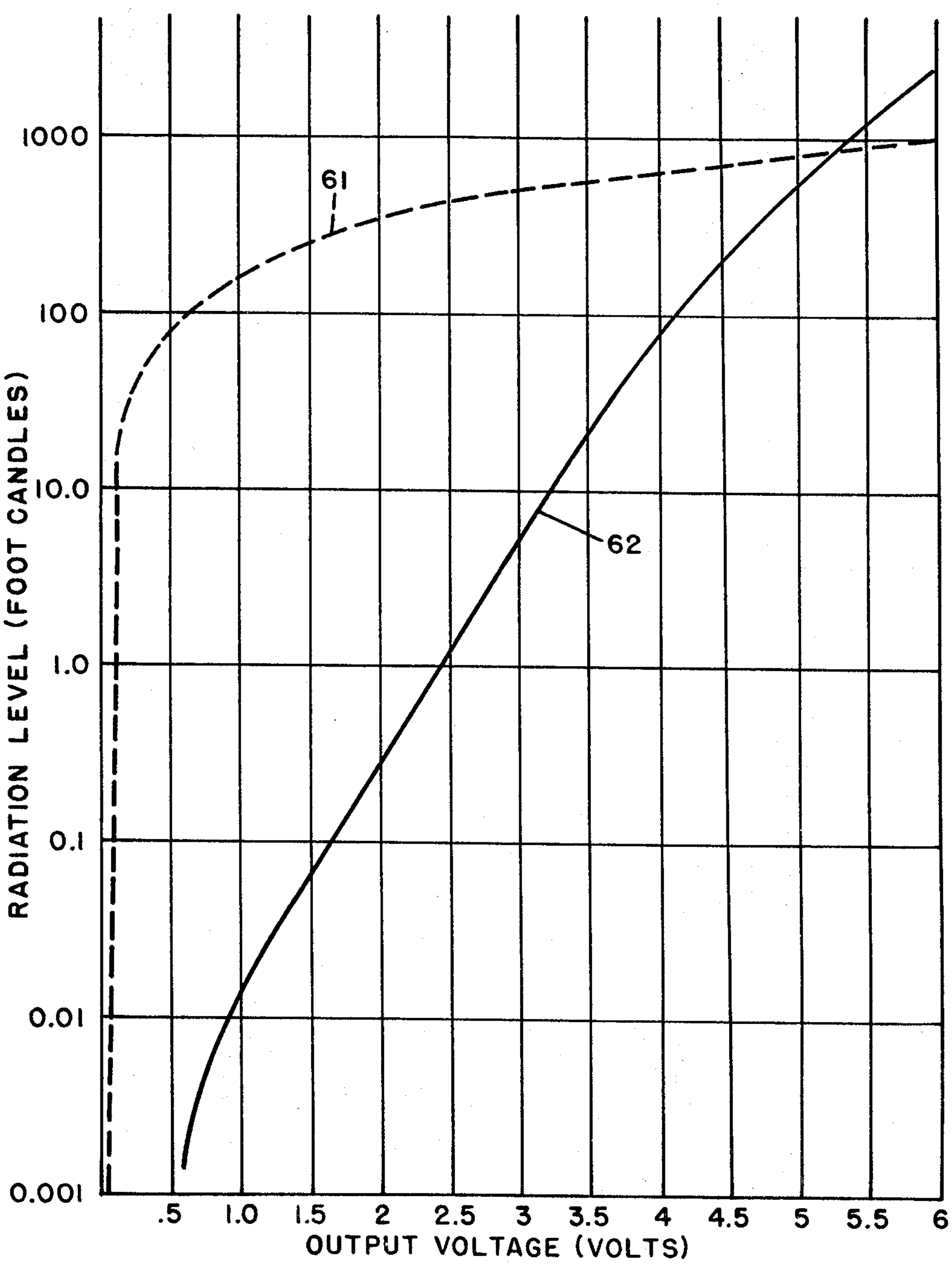
FIG. 3 is a graphical representation plotting incident radiation level vs. output voltage for both a conventional photosensitive field effect transistor circuit and the logarithmically responsive circuit shown in FIG. 2.

Assuming constant values for $R_g$, $G_m$and $R_1$in equation (4) above, the control voltage present on output line 13 is linearly dependent upon the level of radiation, λ, incident on the gate electrode 32. Such a relationship, which is conventional in the prior art, is represented by dotted curve 61 in the logarithmically scaled graphical representation of FIG. 3. Curve 61 clearly demonstrates that a linear output voltage response characteristic renders sensitive control impractical for incident radiation levels in the 0.01 to 100-foot candle range. Furthermore, improvements in sensitivity over any part of the 0.01 to 100-foot candle range by changes in constant circuit component values are achieved only at the expense of greatly reduced overall dynamic range.

The present invention solves this problem and provides a useful radiation measuring system of greatly improved dynamic range by employing an output voltage responsive variable gate impedance for the FET 31. The gate impedance comprises the left half, 47, 53 and 54 of the dual FET 48 and its magnitude is controlled by a feedback circuit 60 including the transistor amplifier 41 and the resistors 44 and 49 connected between the DRAIN electrode 38 of the photosensitive FET 31 and the gate electrodes 46 and 47 of the dual FET 48. As output voltage across the resistor 37 increases in response to increasing levels of radiation incident on the gate electrode 32, the feedback circuit 60 reduces the voltage applied to the gate electrodes 46 and 47 of the dual FET 48. This in turn reduces the effective impedance provided by the FET 48 in the gate electrode circuit of the photosensitive FET 31. Consequently, relative reductions occur in gate voltage, $V_g$, drain current, $I_d$, and output voltage, $V_o$, as shown by equations (1), (2) and (3) above. By appropriate selection of the various circuit components, a logarithmic relationship between the effective impedance provided of the dual FET 48 and the output voltage, $V_o$, can be established. This in turn creates for the measuring circuit 12 a logarithmic relationship between output voltage, $V_o$, and the level of radiation, λ, incident on the gate electrode 32 of the photosensitive FET 31.

The operation of the circuit of field 2 will now be explained. Radiation which is incident upon the gate electrode 32 of photo FET 31 will cause current to flow from the drain electrode 38 to the gate electrode 32 and then through FET 54, which has an impedance, to ground. The flow of the gate current through the impedance of FET 54 will raise the voltage on gate electrode 32 of photo FET 31. The higher voltage at gate electrode 32 causes a current to flow between drain electrode 38 and source electrode 33. This drain to source current flows through load resistor 37, which has the effect of lowering the voltage applied to the base of transistor 41, which turns transistor 41 on. The turning on of transistor 41 causes current to flow through resistor 44 which produces a higher voltage above resistor 44 and a higher voltage at the gate electrode of FET 48. The higher voltage at the gate of FET 48 lowers the drain to source impedance across FET 48 which lowers the voltage at gate 32 and causes less current to flow between drain and source electrodes 38 and 33 of photo FET 31. The change in drain to source resistance of FET 48 has a logarithmic relationship to the voltage applied to the gate terminal. In this manner, the photo FET 41 is caused to respond in a logarithmic manner to light which is incident upon its gate electrode.

Since output voltage, $V_o$, is applied by the feedback circuit 60 to the gate electrode 57 for the FET 48, the isolated control signal output on line 13 also varies logarithmically with respect to sensed radiation level. This relationship is represented by the solid curve 62 in the graphical representation of FIG. 3. As demonstrated by curve 62, the logarithmic response characteristic of the measuring circuit 12 provides substantially larger voltage changes for lower levels of incident radiation while maintaining a desired dynamic operating range of between 0.01 to 1000-foot candles.

The measuring system 12 is obviously well suited for use with a film camera wherein lens aperture control logarithmically related to incident light levels is particularly desirable. However, as noted above, the measuring system 12 and the regulator 11 can be used in a similar manner to control other visual data responsive devices. For example, the servomotor 21 could be operatively coupled to the sensitivity adjustment mechanism of a vidicon camera tube, to the shutter speed adjustment mechanism of a film camera, or to the position control device of a neutral density wedge in a film processor.

Obviously, many modifications and variations of the present invention are possible in light of the above teachings. It is to be understood, therefore, that the invention can be practiced otherwise than as specifically described.

What is claimed is:

1. Apparatus for measuring radiation with a first photosensitive semiconductive device and for causing said first photosensitive semiconductive device to respond logarithmically to levels of radiation being measured, and comprising:

a. a first, photosensitive, three terminal, semiconductive device having a drain, source and gate electrode, said gate electrode including means for responding to incident radiation to change the drain to source impedance across the semiconductive device;

b. means for directing radiation, the level of which is to be measured, onto said date electrode;

c. means for applying an electrical potential across the said drain and source electrodes of the first semiconductive device to produce a signal across the first semiconductive device which varies as the drain to source impedance of the first semiconductive device changes in response to changes in the level of incident radiation on said gate electrode;

d. said gate electrode having a second three terminal semiconductive device, having drain, source and gate electrodes, connecting said gate electrode of the first semiconductive device to ground through said drain and source electrodes of the second semiconductive device, said second semiconductive device having a logarithmic relationship between a voltage applied to its gate and its drain to source impedance; and e. means for feeding back to said gate electrode of the second semiconductive device a portion of said signal across the first semiconductive device to logarithmically change the drain to source impedance of the second semiconductive device in accordance with said signal across the first semiconductive device, whereby the logarithmic relationship of said drain to source impedance to said fed back signal will cause said first semiconductive device to respond to said incident radiation on its gate electrode with a signal which is logarithmically related to the level of said incident radiation.

2 Apparatus as set forth in claim 1 wherein said first photosensitive semiconductive device comprises a photosensitive field effect transistor.

3. Apparatus as set forth in claim 2 wherein said second semiconductive device comprises a field effect transistor.

4. Apparatus as set forth in claim 3 wherein:

a. said second semiconductive device comprises a dual field effect transistor having first and second field effect transistor components with the gate electrodes of said first and second field effect transistor components being connected in common;

b. said first field effect transistor component connects said gate electrode of the photosensitive field effect transistor to ground through the drain and source electrodes of the first field effect transistor components; and c. said second field effect transistor component includes means for producing an output signal which is electrically isolated from said photosensitive field effect transistor.

5. Apparatus as set forth in claim 4 wherein said means for feeding back includes a semiconductor amplifier means connected between said drain electrode of the photosensitive field effect transistor and said gate electrodes of the dual field effect transistor.

6. Apparatus as set forth in claim 5 wherein said apparatus is included within a system which comprises:

a. a visual data responsive means;

b. regulator means for variably regulating the light responsiveness of said visual data responsive means; and c. said regulator means includes means for responding to the output signal from said second field effect transistor component.

7. Apparatus as set forth in claim 1 wherein said second semiconductive device comprises a field effect transistor.

8. Apparatus as set forth in claim 7 wherein:

a. said second semiconductive device comprises a dual field effect transistor having first and second field effect transistor components with the gate electrodes of said first and second field effect transistor components being connected in common;

b. said first field effect transistor component connects said gate electrode of the first semiconductive device to ground through the drain and source electrodes of the first field effect transistor component; and c. said second field effect transistor component includes means for producing an output signal which is electrically isolated from said first semiconductive device.

9. Apparatus as set forth in claim 8 wherein said apparatus is included within a system which comprises:

a. visual data responsive means;

b. regulator means for variably regulating the light responsiveness of said visual data responsive means; and c. said regulator means includes means for responding to the output signal from said second field effect transistor component.

10. Apparatus as set forth in claim 1 wherein said apparatus is included within a system which comprises:

a. visual data responsive means; and b. regulator means for variably regulating the light responsiveness of said data responsive system in response to the signal across the first semiconductive device.